(12) United States Patent
Hurbi et al.

(10) Patent No.: US 10,299,407 B2
(45) Date of Patent: May 21, 2019

(54) DIFFERENTLY ORIENTED LAYERED THERMAL CONDUIT

(71) Applicant: MICROSOFT TECHNOLOGY LICENSING, LLC, Redmond, WA (US)

(72) Inventors: Erin Hurbi, San Francisco, CA (US); Michael Nikkhoo, Saratoga, CA (US); Douglas L. Heirich, Palo Alto, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 661 days.

(21) Appl. No.: 14/754,483

(22) Filed: Jun. 29, 2015

(65) Prior Publication Data
US 2016/0381832 A1  Dec. 29, 2016

(51) Int. Cl.
*B23P 15/26* (2006.01)
*H05K 7/20* (2006.01)
(Continued)

(52) U.S. Cl.
CPC .......... *H05K 7/20509* (2013.01); *B23P 15/26* (2013.01); *F28F 21/02* (2013.01); *G02B 27/0176* (2013.01); *H01L 23/373* (2013.01); *H01L 23/3733* (2013.01); *B23P 2700/10* (2013.01); *F28D 2021/0028* (2013.01); *F28F 2013/001* (2013.01); *F28F 2255/00* (2013.01); *H01L 2023/4068* (2013.01)

(58) Field of Classification Search
CPC ............. H01L 2023/4068; F28F 21/02; G02B 27/0176

USPC ......................................................... 165/185
See application file for complete search history.

(56) References Cited

U.S. PATENT DOCUMENTS

| 4,867,235 A | 9/1989 | Grapes et al. |
| 2002/0182397 A1 | 12/2002 | Whatley |
(Continued)

FOREIGN PATENT DOCUMENTS

| CN | 101048862 A | 10/2007 |
| CN | 101115627 A | 1/2008 |
(Continued)

OTHER PUBLICATIONS

IPEA European Patent Office, Second Written Opinion Issued in PCT Application No. PCT/US2016/037464, dated May 3, 2017, WIPO, 7 Pages.
(Continued)

*Primary Examiner* — Keith M Raymond
*Assistant Examiner* — Nael N Babaa
(74) *Attorney, Agent, or Firm* — Alleman Hall Creasman & Tuttle LLP

(57) ABSTRACT

A thermal conduit configured to conduct heat from a heat source to a heat sink and method of forming said conduit are disclosed herein. The thermal conduit may comprise a plurality of stacked sheets formed of an anisotropically thermally conductive material, a non-limiting example of which is graphite, each sheet with a respective orientation of thermal conduction. The orientations of thermal conduction of the plurality of sheets may change stepwise in a stacking direction to form a curved thermal flow path.

20 Claims, 7 Drawing Sheets

(51) Int. Cl.
  *F28F 21/02* (2006.01)
  *H01L 23/373* (2006.01)
  *G02B 27/01* (2006.01)
  *H01L 23/40* (2006.01)
  *F28F 13/00* (2006.01)
  *F28D 21/00* (2006.01)

(56) References Cited

U.S. PATENT DOCUMENTS

| | | | |
|---|---|---|---|
| 2009/0095461 A1* | 4/2009 | Lemak | H01L 23/373 165/185 |
| 2009/0325071 A1 | 12/2009 | Verbrugge et al. | |
| 2010/0128439 A1 | 5/2010 | Tilak et al. | |
| 2012/0315482 A1 | 12/2012 | Muramatsu et al. | |
| 2013/0082984 A1 | 4/2013 | Drzaic et al. | |
| 2013/0167897 A1 | 7/2013 | Choi et al. | |
| 2014/0110049 A1 | 4/2014 | Yuen et al. | |
| 2014/0190676 A1 | 7/2014 | Zhamu et al. | |
| 2014/0224466 A1 | 8/2014 | Lin et al. | |
| 2014/0225871 A1 | 8/2014 | Kim et al. | |
| 2014/0287239 A1 | 9/2014 | Scurati et al. | |
| 2015/0029661 A1 | 1/2015 | Huang et al. | |
| 2016/0104655 A1 | 4/2016 | Kawabata | |

FOREIGN PATENT DOCUMENTS

| | | |
|---|---|---|
| CN | 101822134 A | 9/2010 |
| CN | 102651961 A | 8/2012 |
| CN | 103904366 A | 7/2014 |
| CN | 104038173 A | 9/2014 |
| EP | 0971407 A1 | 1/2000 |
| EP | 2071399 A1 | 6/2009 |
| EP | 2327542 A1 | 6/2011 |
| JP | H03164415 A | 7/1991 |
| JP | 2001261851 A | 9/2001 |
| JP | 2012141093 A | 7/2012 |
| JP | 2014229714 A | 12/2014 |
| KR | 20110054211 A | 5/2011 |
| KR | 101386765 B1 | 4/2014 |
| WO | 2014203547 A1 | 12/2014 |
| WO | 2015083316 A1 | 6/2015 |

OTHER PUBLICATIONS

Shen, et al., "Heat Transfer Mechanism across Few-Layer Graphene by Molecular Dynamics", In Journal of Physical Review, Jul. 312, 2013, 4 pages.

Cheng, et al., "Graphene Fiber: A New Material Platform for Unique Applications", In Journal of NPG Asia Materials, vol. 6, Jul. 18, 2014, 22 pages.

"Researchers Develop World's Thinnest Electric Generator", Published on: Oct. 15, 2014 Available at: http://phys.org/news/2014-10-world-thinnest-electric.html.

Hashimoto, et al., "Graphene Edge Spins: Spintronics and Magnetism in Graphene Nanomeshes", In Journal of Nanosystems: Physics, Chemistry, Mathematics, vol. 5, Issue 1, Feb. 2014, pp. 25-38.

Reiter, Fernando, "Carbon Based Nanomaterials as Transparent Conductive Electrodes", In Thesis, Aug. 2011, 173 pages.

ISA European Patent Office, International Search Report and Written Opinion Issued in PCT Application No. PCT/US2016/037464, dated Sep. 26, 2016, WIPO, 15 pages.

"First Office Action and Search Report Issued in Chinese Patent Application No. 201680038658.9", dated Feb. 15, 2019, 13 Pages.

* cited by examiner

DIFFERENTLY ORIENTED LAYERED THERMAL CONDUIT

BACKGROUND

High-powered computing devices produce large amounts of heat that are preferably directed quickly and efficiently away from the source of the heat and dissipated into the environment so that performance of the device is not impacted by high temperatures. For wearable devices such as head-mounted display (HMD) devices, the surface temperature of the device affects the usability and comfort of the user, and thus heat dissipation is especially important. Further, in order to be wearable, the device should be lightweight and durable even with the addition of a heat dissipating mechanism.

Graphite is one example of an anisotropically thermally conductive material, meaning that it conducts heat very well within a plane (along two dimensions), but very poorly along a third dimension, out of the plane. Using such an anisotropically conductive material to dissipate heat presents some challenges. While graphite is flexible, it does not attach well at lateral sides of the plane, particularly if the graphite is bent to form a curve. Thus, attaching components at the edges of the plane may increase the space needed to house the graphite. In addition, if heat is directed into the graphite straight into the plane, along the third dimension, the graphite will resist the flow of heat due to the poor thermal conductivity in that dimension until the heat is able to flow within the plane. Similar problems arise when leading heat out of the graphite through the third, poorly conductive, dimension.

SUMMARY

A thermal conduit configured to conduct heat from a heat source to a heat sink and method of forming said conduit are disclosed herein. The thermal conduit may comprise a plurality of stacked sheets formed of an anisotropically thermally conductive material, a non-limiting example of which is graphite, each sheet with a respective orientation of thermal conduction. The orientations of thermal conduction of the plurality of sheets may change stepwise in a stacking direction to form a curved thermal flow path. According to one aspect of the disclosure, the plurality of sheets may be slices from blocks of the anisotropically thermally conductive material that have been sliced at corresponding angles and stacked such that the orientations of thermal conduction change stepwise in the stacking direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
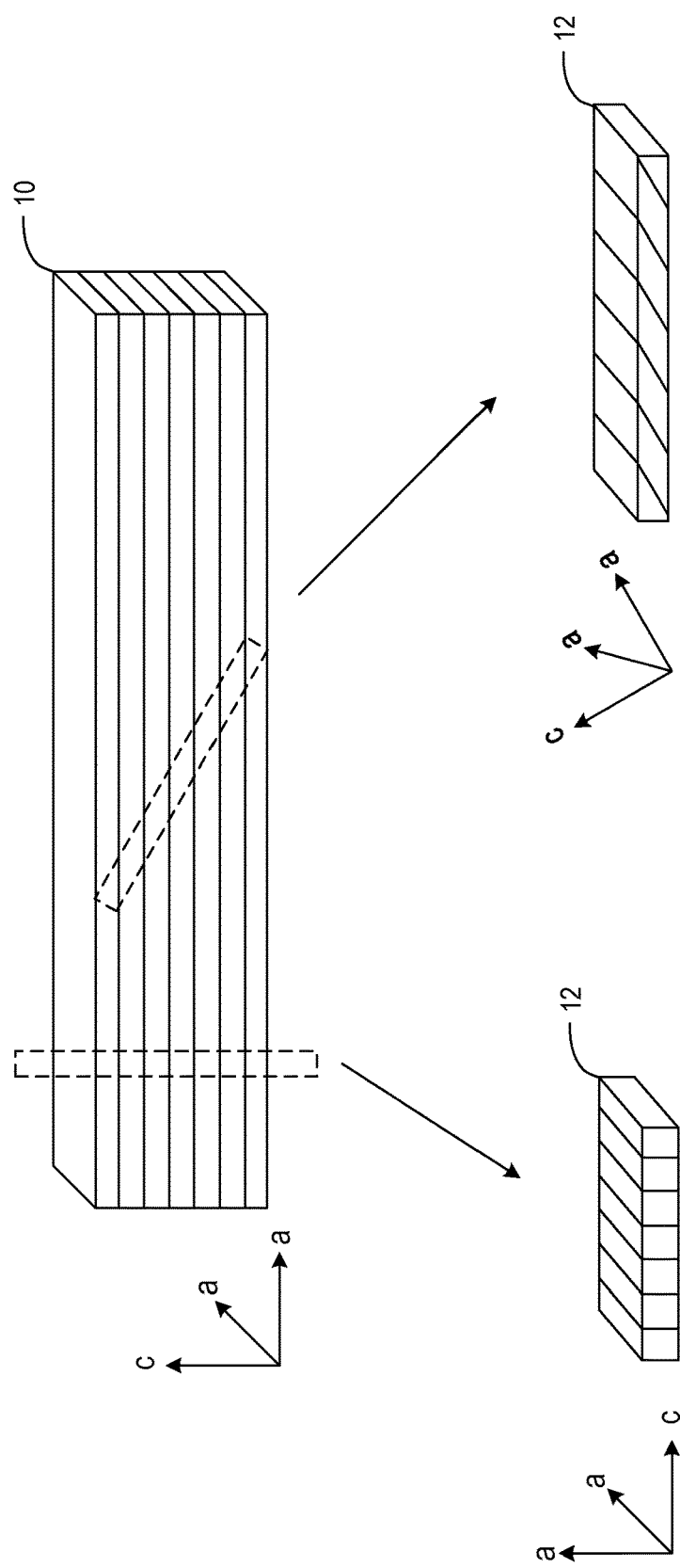
FIG. 1 is an illustration of an anisotropically thermally conductive material being sliced to form sheets.

FIG. 1 is an illustration of an anisotropically thermally conductive material being sliced to form sheets. A block 10 of the anisotropically thermally conductive material may have layers oriented in a plane such that the direction normal to the plane, and thus to the layers, is a c-axis, while the two dimensions by which the plane is defined may be a-axes. The anisotropically thermally conductive material may conduct heat poorly very along the c-axis (i.e., orthogonally to the plane) and may conduct heat very well along each a-axis (i.e., along the plane). The anisotropically thermally conductive material may have a substantially low thermal conductivity along the c-axis compared to the a-axes. For example, the thermal conductivity of the a-axes may be 100-1000 times greater along the a-axes than the c-axis, depending on the material and construction. The anisotropically thermally conductive material may be graphite, for example. Some anisotropically thermally conductive materials may be conductive in one dimension and not conductive in two dimensions.

A plurality of sheets 12 may be slices from the block(s) 10 of the anisotropically thermally conductive material that have been sliced at corresponding angles. When the anisotropically thermally conductive material is graphite, the blocks 10 may be formed by layering graphene. The area of the block 10 at which each example sheet 12 is cut is shown in dashed lines. The corresponding angle at which the sheets 12 are sliced from the block(s) 10 may determine an orientation of thermal conduction of each sheet 12. The sheets 12 may be sliced at any angle and are not limited to the angles shown in the example of FIG. 1. The angles are also not limited to those that are orthogonal to the page of FIG. 1 and may be, for example, slanted in three dimensions. For the sheet 12 on the left in FIG. 1, the orientation of thermal conduction is vertical and into the page, as shown by a-axes in the legend. The c-axis extends left and right, where the sheet 12 has poor thermal conductivity. For the sheet 12 on the right in FIG. 1, the orientation is tilted to the left, as shown by the a-axes in the respective legend. Slicing the sheets 12 at specified angles may allow for the sheets 12 to be stacked such that the orientations of thermal conduction change stepwise in a stacking direction, as explained in detail below. However, it will be appreciated that the sheets 12 may be imparted with the respective orientations of thermal conduction in other suitable manners than slicing blocks 10 at corresponding angles.

Figure 2:
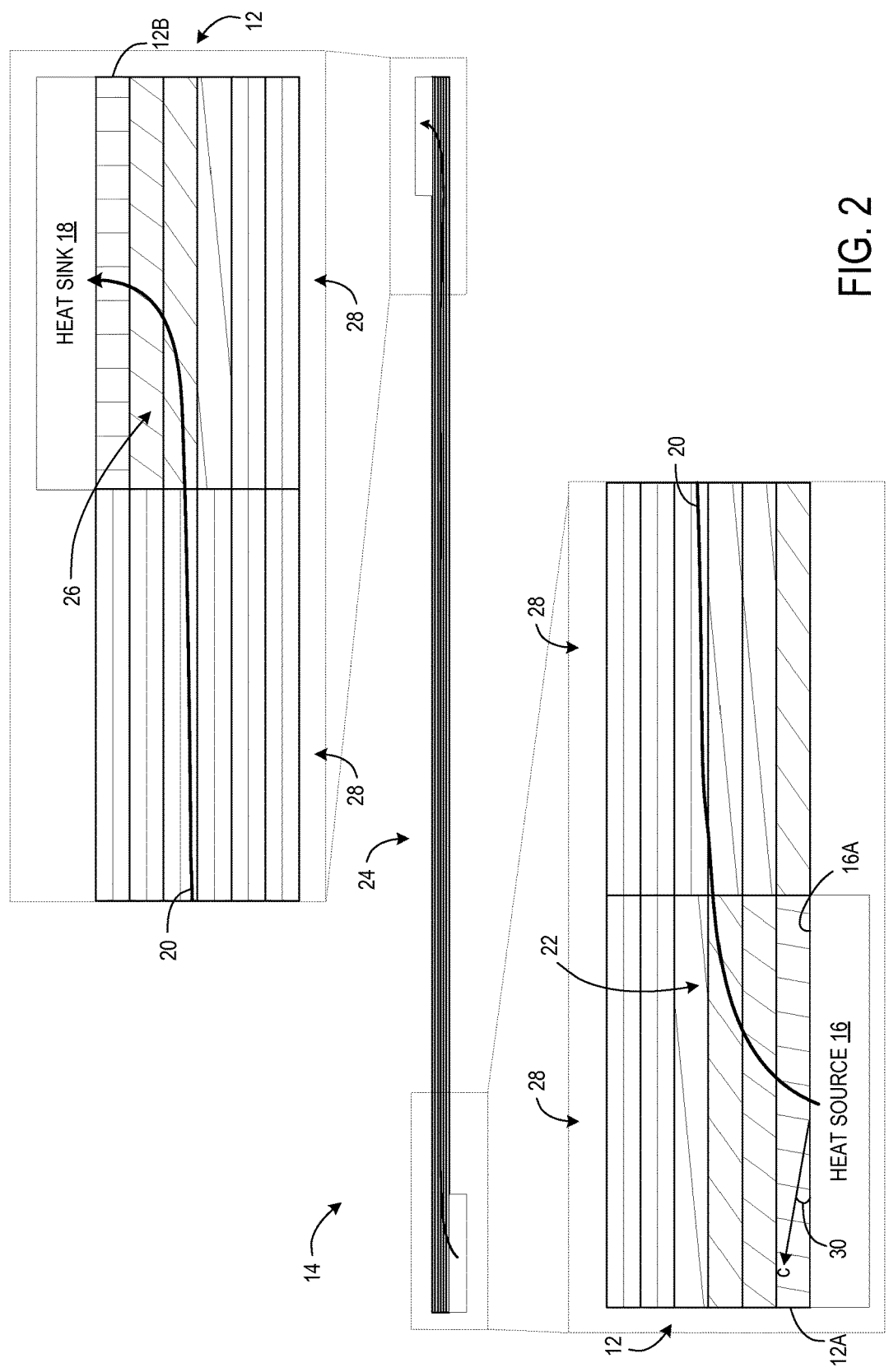
FIG. 2 is an illustration of a thermal conduit according to a first embodiment.

FIG. 2 is an illustration of a thermal conduit 14 according to a first embodiment. The thermal conduit 14 may be configured to conduct heat from a heat source 16 to a heat sink 18. The heat source 16 may generate the heat or may merely be the last component through which heat is transferred before reaching the conduit 14. The heat sink 18 may be configured to dissipate the heat received from the conduit 14 and may be a finned component, a surface open to the environment, etc. Although the term "heat sink" may suggest that the heat is transferred to the heat sink 18 in order to cool down or otherwise prevent the heat source 16 from overheating, the thermal conduit 14 may also be used to heat the heat sink 18 with heat provided by the heat source 16.

The conduit 14 may comprise a plurality of the stacked sheets 12 formed of the anisotropically thermally conductive material, each sheet with a respective orientation of thermal conduction. When the sheets 12 with varying orientations are stacked up and pressure is applied to join them together, the orientations of thermal conduction of the plurality of sheets 12 may change stepwise in the stacking direction to form a curved thermal flow path 20. The stacking direction of the sheets 12 in FIG. 2 is vertical. By choosing a sheet 12 with a specific orientation for each layer in the conduit 14, the thermal flow path 20 may be directed toward the heat sink 18 in an efficient manner. Thus, the heat encounters less resistance and is conducted past the initial surface of the conduit 14 much faster than a case with a simple conductor where the heat enters through the c-axis.

Figure 3:
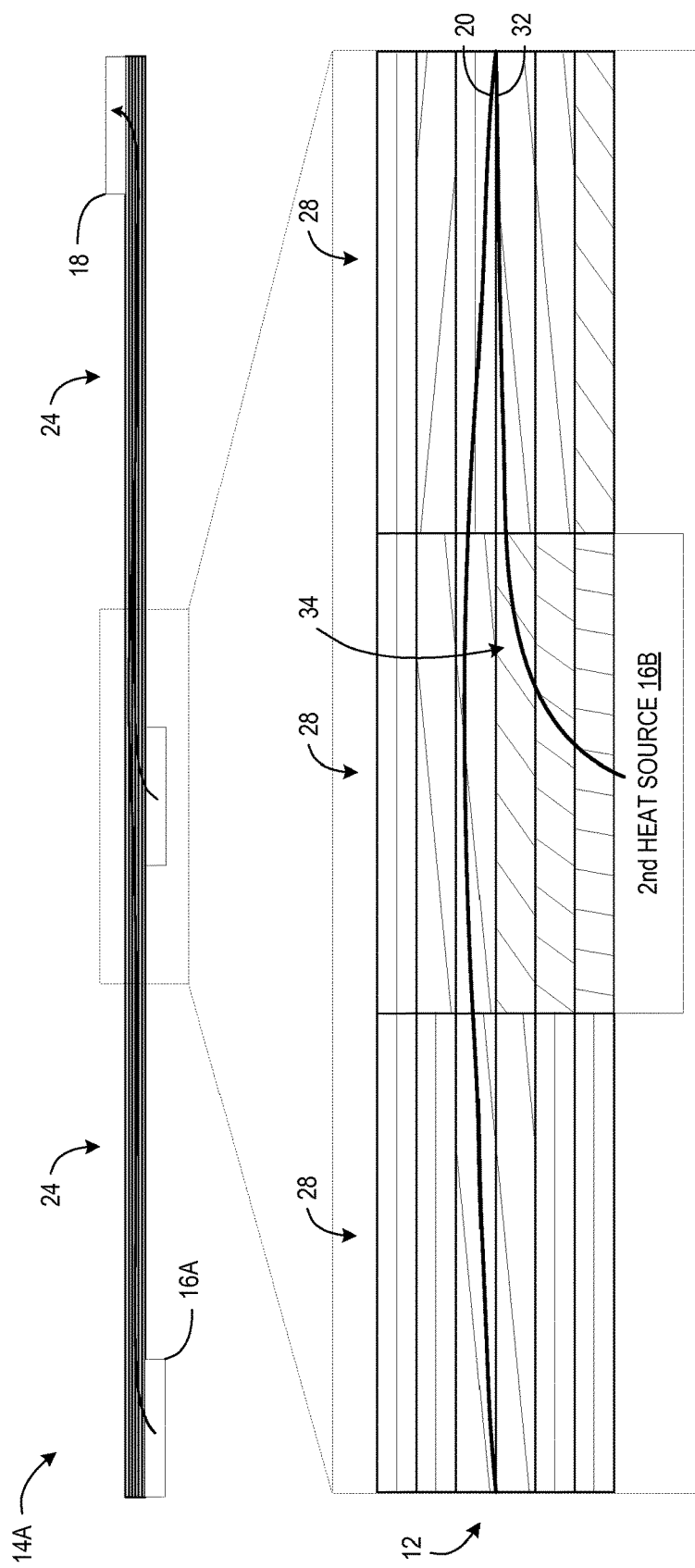
FIG. 3 is an illustration of a thermal conduit according to a second embodiment.
Figure 4:
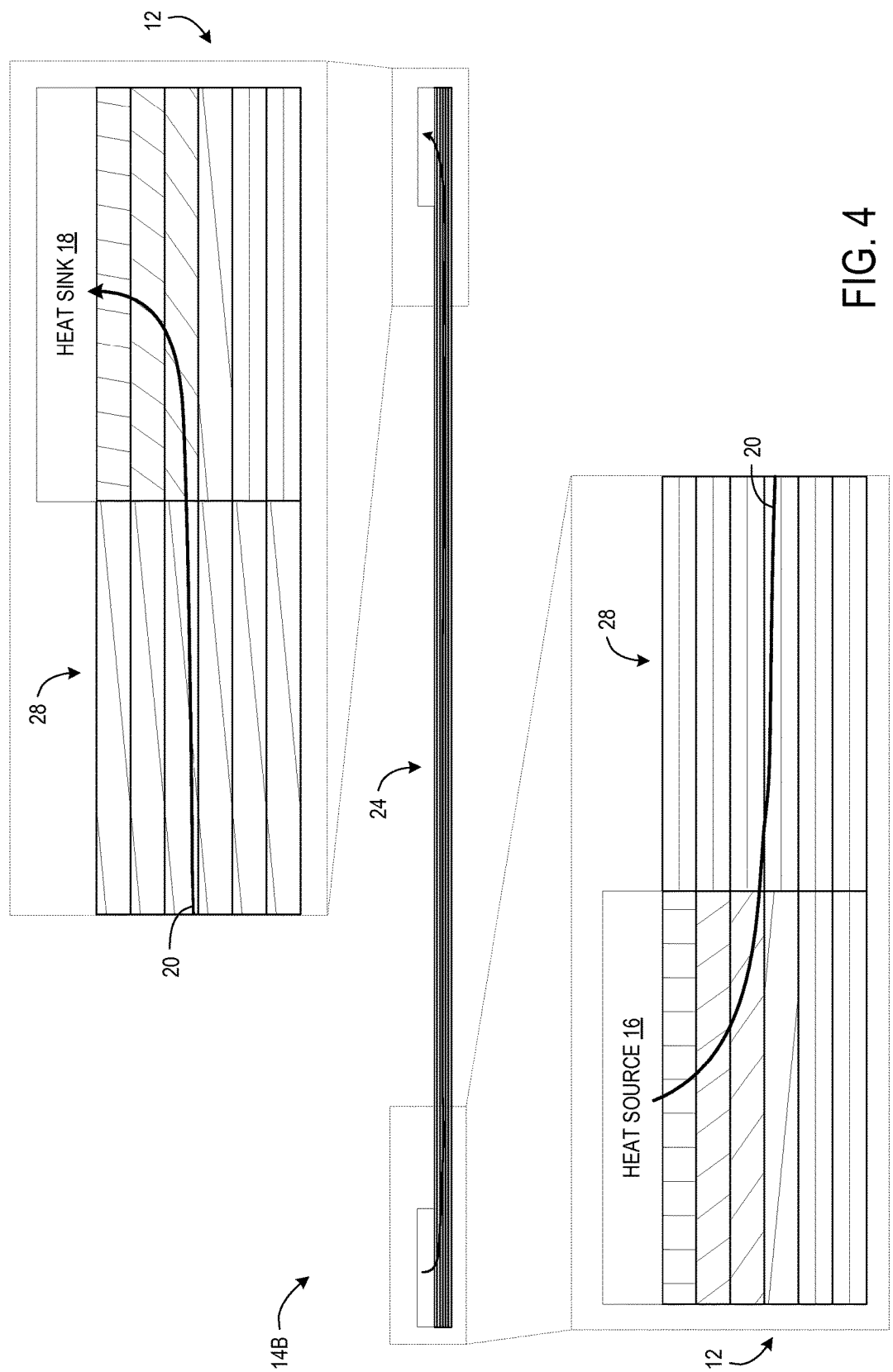
FIG. 4 is an illustration of a thermal conduit according to a third embodiment.

As the height of the conduit 14 may be very short compared to the length, some portions of FIGS. 2-4 have been magnified to show examples of how the sheets 12 may be stacked to form the thermal flow path 20. It will be understood that these figures are simplified examples and fewer or more sheets 12 may be stacked to form the conduit 14 than are shown. Further, each sheet 12 shown may be a single sheet or multiple sheets stacked together. At least a portion of the thermal conduit 14 may have an elongated rectangular shape. In FIGS. 2-5, the entire conduit is shown as having an elongated rectangular shape, but a variety of other shapes may be possible without departing from the present disclosure.

As shown in FIG. 2, the thermal flow path may comprise at least a first curve 22 from the heat source 16 to a mid portion 24 of the thermal conduit 14 and a second curve 26 from the mid portion 24 to the heat sink 18. The mid portion 24 may be the majority of the conduit 14 and may have a substantially uniform orientation of thermal conduction. Heat flowing through the mid portion 24 may utilize the cross section of the mid portion 24 to traverse the conduit 14 quickly. To analogize, in such a configuration the curve 22 may serve as an "on ramp" for the heat to travel to the "highway" of the mid portion 24 where the heat may transfer comparatively faster, and the curve 26 may serve as an "off ramp" to steer the heat from the mid portion 24 to the heat sink 18.

The first curve 22 may be formed in a single stack 28 after the heat source 16 and before the mid portion 24, or the conduit 14 may comprise one or more additional stacks 28 to gradually direct the thermal flow path from the heat source 16 into the mid portion 24, as shown in FIG. 2. Similarly, the second curve 26 may be formed in a single stack 28 after the mid portion 24 and before the heat sink 18, as shown in FIG. 2, or the conduit 14 may comprise one or more additional stacks 28 to gradually direct the thermal flow path from the mid portion 24 into the heat sink 18. The plurality of stacked sheets 12 may be formed in a plurality of stacks 28 arranged orthogonally relative to the stacking direction, and the orientation of thermal conduction of at least some of the sheets 12 at corresponding positions in the stacking direction in neighboring stacks 28 may be different from each other. For example, the first stack 28 adjacent to the heat source 16 has sheets 12 with varying orientations, while the stack 28 to the right also has sheets 12 with varying orientations. The top two sheets 12 in each stack 28 are shown as having the same orientations (their a-axes are horizontal), while the orientations of the bottom four sheets 12 are different. Changing the orientations of the sheets 12 stepwise between stacks 28 allows the thermal flow path 20 to be engineered in more shapes and more finely directed than if only one stacking pattern is used in the entire thermal conduit 14.

As mentioned above, each sheet 12 of the plurality of sheets 12 may comprise a c-axis along which the anisotropically thermally conductive material has a relatively low thermal conductivity compared to at least an a-axis of the sheet 12. Of the plurality of sheets 12, an entry sheet 12A adjacent to the heat source 16 may be configured such that its c-axis forms an entry angle 30 with an adjacent surface 16A of the heat source 16 that is greater than 0° and less than 90°. The entry angle 30 shown in FIG. 2 is 10°. With an entry angle 30 that is between perpendicular and parallel, the direction of the thermal flow path 20 may change to form the first curve 22 beginning with the entry sheet 12A. A component attached to the conduit 14 at a location where the c-axis is not parallel to the surface of the component may be more securely attached in some configurations. However, such a parallel configuration may nonetheless be used, as shown by an exit sheet 12B adjacent to the heat sink 18.

FIG. 3 is an illustration of a thermal conduit 14A according to a second embodiment. It will be appreciated that previously described components are referred to by the same reference characters in subsequent embodiments and their descriptions are not repeated. In the thermal conduit 14A, the heat source 16 may be a first heat source 16A, and the thermal conduit 14 may further comprise an introduction path 32 to conduct heat from a second heat source 16B to the heat sink 18. The introduction path 32 may include a third curve 34 and merge with the thermal flow path 20. The inclusion of the introduction path 32 may be accommodated by directing the thermal flow path 20 away from the introduction path 32 upstream before merging downstream. The conduit 14A is not limited to only two heat sources 16A, 16B, and may comprise any reasonable number. Each heat source 16 may have a respective introduction path 32 such that the heat from each heat source 16 may travel through the mid portion(s) 24 before reaching the heat sink 18. The conduit 14A may even comprise more than one heat sink 18, according to the size and shape of the conduit 14A and the arrangement of the heat sources 16A, 16B.

FIG. 4 is an illustration of a thermal conduit 14B according to a third embodiment. While the thermal conduits 14 and 14A were shown with the heat source 16 (heat sources 16A, 16B in FIG. 3) on the bottom and the heat sink 18 on the top of the conduit 14 or 14A, other arrangements may be adopted. For example, the thermal conduit 14B is connected to the heat source 16 and heat sink 18 on the same side of the conduit 14B. This configuration may be suitable for a circuit board where multiple components are mostly arranged on one side of the conduit 14B, although features of the various disclosed embodiments may be suitably combined.

Figure 5:
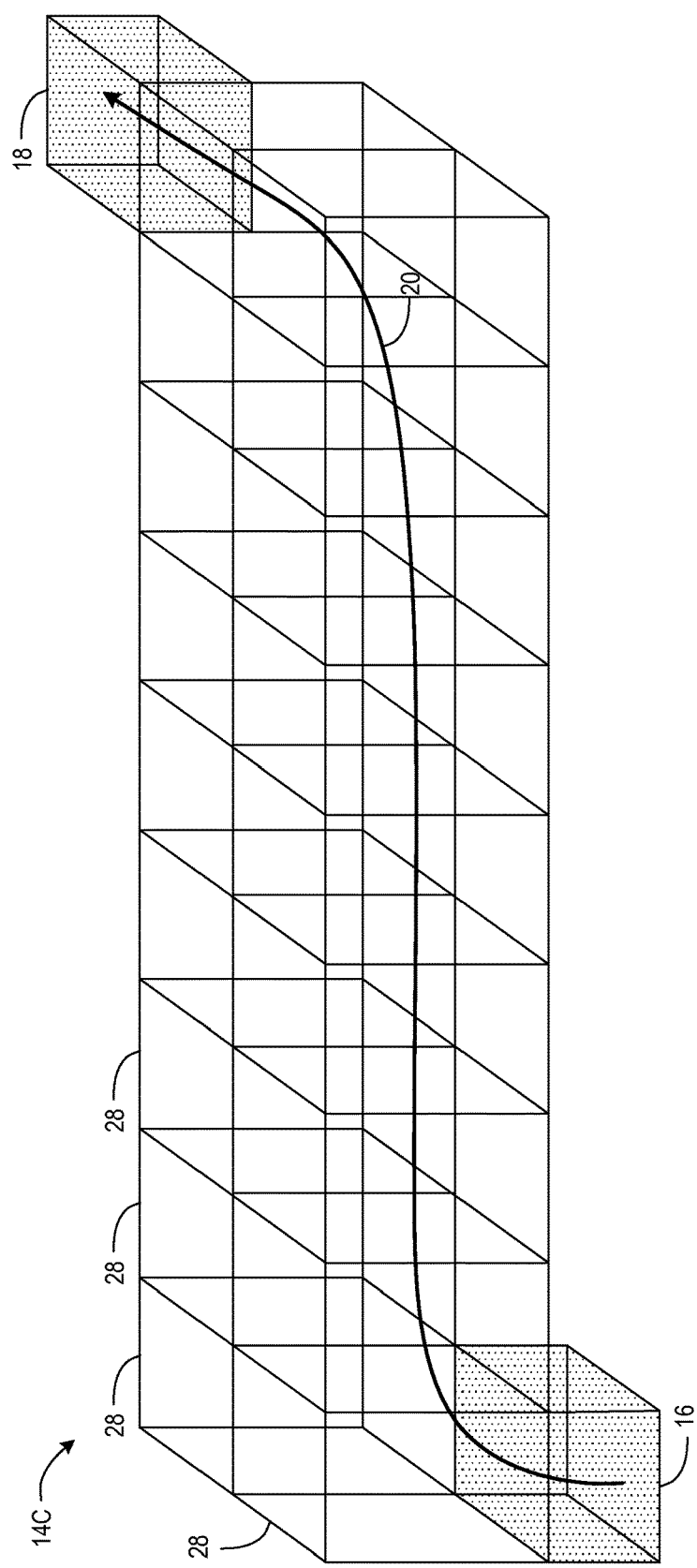
FIG. 5 is an illustration of a thermal conduit according to a fourth embodiment.

FIG. 5 is an illustration of a thermal conduit 14C according to a fourth embodiment. The conduit 14C is shown in a simplified and transparent manner to illustrate one example of how the thermal flow path 20 may traverse the thermal conduit 14C in three dimensions. Because the sheets 12 may be formed with any chosen respective orientations of thermal conduction (see FIG. 1) and the conduit 14C may comprise multiple stacks 28 that are orthogonal to one another, the thermal flow path 20 may be customized so that the heat source(s) 16 and heat sink(s) 18 may be attached at any portion of the conduit 14C. The heat source(s) 16 and heat sink(s) 18 may contact more than one sheet 12, or merely a portion of one sheet 12. In the illustrated example of FIG. 5, the thermal flow path begins below the conduit 14C, curves upward and to the right, and then curves to the rear to exit behind the conduit 14C.

Figure 6:
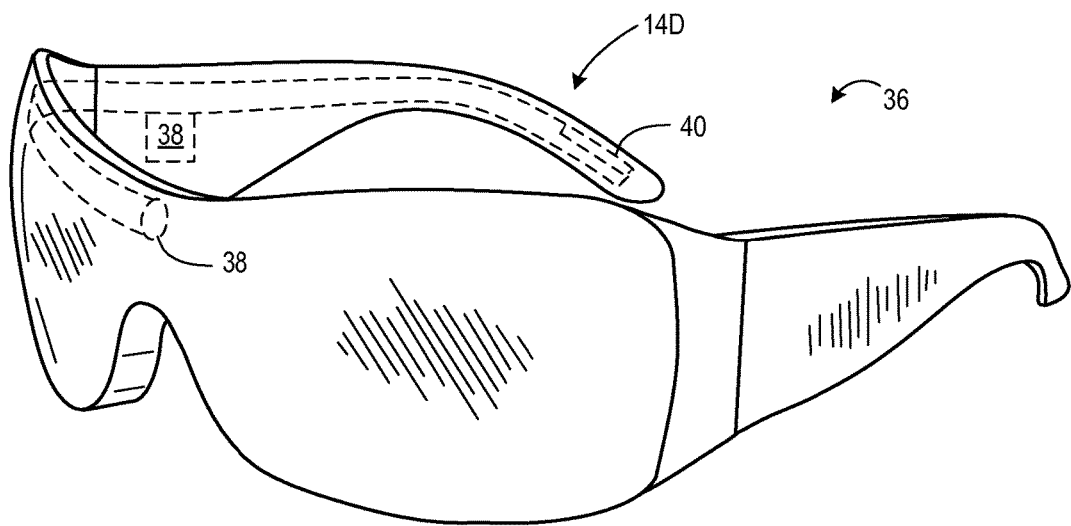
FIG. 6 is an illustration of a thermal conduit incorporated into a head-mounted display (HMD) device.
Figure 7:
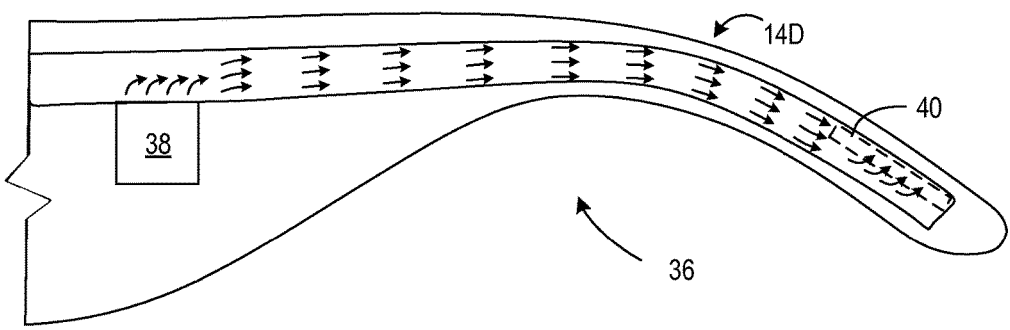
FIG. 7 shows a portion of the HMD device.

The thermal conduit 14 may be utilized in a variety of applications, including various types of computing devices. FIG. 6 is an illustration of a thermal conduit 14D according to a fifth embodiment, incorporated into a head-mounted display (HMD) device 36. In the example of FIG. 6, the heat source 16 may be a heat generating component 38 mounted in the HMD device 36 and the heat sink 18 may be a heat dissipating component 40 mounted in the HMD device 36. The heat generating component 38 may be, for example, a projector, a camera, or a processor, among other possibilities. The heat dissipating component 40 may facilitate heat dissipation with the environment outside of the HMD device 36. The conduit 14D is shown here as a rectangular band that is flexed to curve with the contours of the HMD device 36, although other cross-sectional shapes are possible. The conduit 14D is shown extending along the right half of the HMD device 36D, from a user's perspective, but it may also extend throughout different portions of the HMD device 36, including the entire length of the HMD device 36. If the HMD device 36 is continuous around the user's head, the conduit 14D may also extend around the user's head. The size and shape of the conduit 14D used may depend on the location of each heat generating component 38. FIG. 7 shows a portion of the HMD device 36 with the thermal conduit 14D. The arrows indicate the flow of heat from the heat generating component 38 to the heat dissipating component 40.

Figure 8:
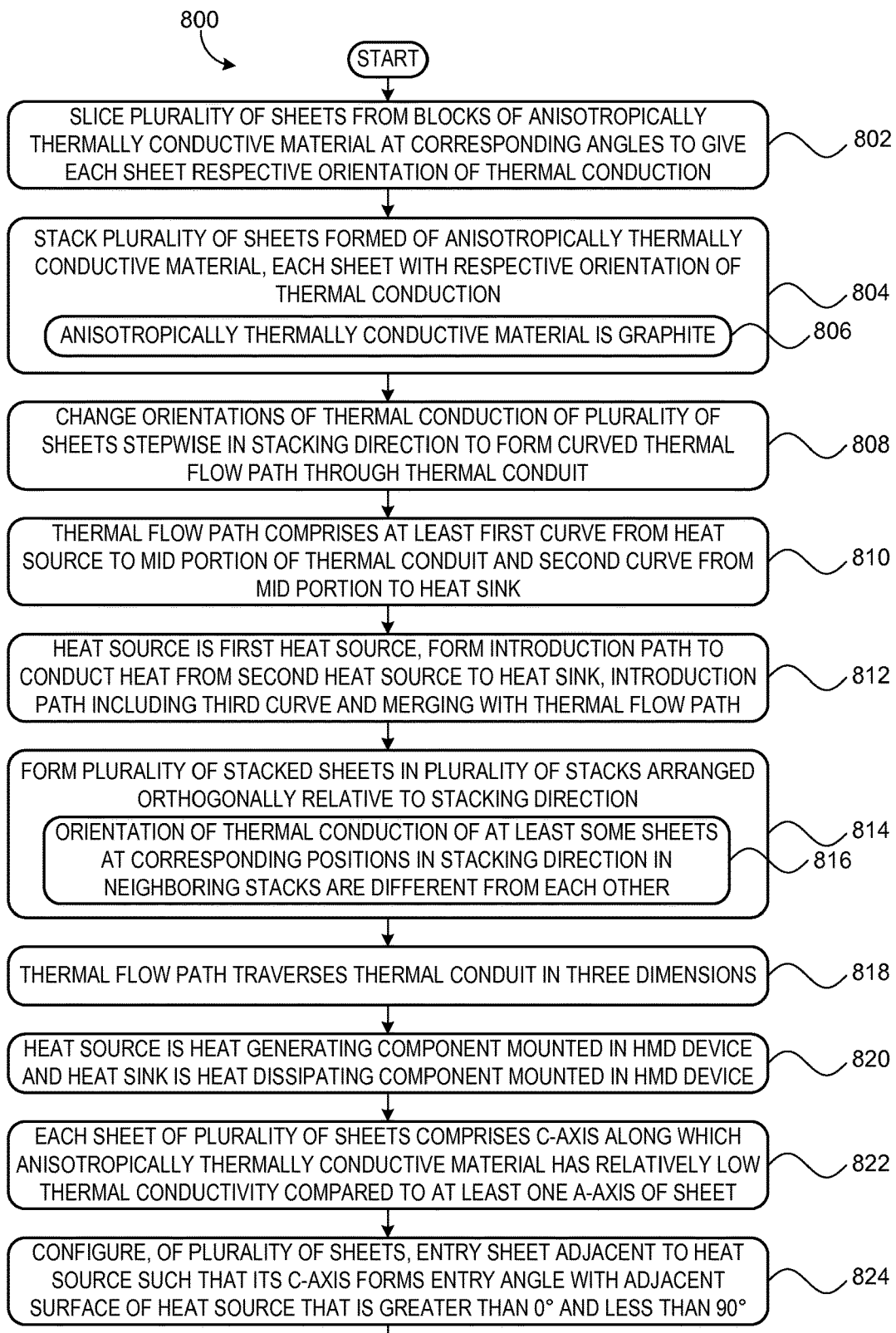
FIG. 8 is a flowchart of a method of forming the thermal conduit.

FIG. 8 shows a flowchart of a method 800 of forming a thermal conduit configured to conduct heat from a heat source to a heat sink. The following description of method 800 is provided with reference to the thermal conduits 14, 14A, 14B, 14C, and 14D, or any combination thereof, described above and shown in FIGS. 1-7. It will be appreciated that method 700 may also be performed in other contexts using other suitable components.

With reference to FIG. 8, at 802, the method 800 may include slicing a plurality of sheets from blocks of an anisotropically thermally conductive material at corresponding angles to give each sheet a respective orientation of thermal conduction. It will be understood that imparting the sheets with the respective orientations of thermal conduction may be performed in other manners. At 804, the method 800 may include stacking the plurality of sheets formed of the anisotropically thermally conductive material, each sheet with the respective orientation of thermal conduction. Once stacked, the sheets may be pressed together to form a flexible, cohesive conduit. At 806, it is illustrated that the anisotropically thermally conductive material may be graphite, although other anisotropically thermally conductive materials may also be used. At 808, the method 800 may include changing the orientations of thermal conduction of the plurality of sheets stepwise in a stacking direction to form a curved thermal flow path through the thermal conduit. The thermal flow path may be approximated as one or more curves as the stepwise construction of the conduit may render the path more or less smooth depending on how finely the steps between sheets are set. Further, a difference in the respective orientations of thermal conduction of two adjacent sheets in a stack may be less than 90° for a smooth transition between stacks.

At 810, the thermal flow path may comprise at least a first curve from the heat source to a mid portion of the thermal conduit and a second curve from the mid portion to the heat sink. The mid portion may be substantially uniform in shape and/or orientation of thermal conduction, and heat traversing the mid portion may do so comparatively quickly due to the low thermal resistance along the c-axis of the mid portion. At 812, the heat source may be a first heat source, and the method 800 may include forming an introduction path to conduct heat from a second heat source to the heat sink, the introduction path including a third curve and merging with the thermal flow path. In order to accommodate the introduction path, the thermal flow path may slightly curve away from the introduction path before they merge downstream.

At 814, the method 800 may include forming the plurality of stacked sheets in a plurality of stacks arranged orthogonally relative to the stacking direction. Utilizing a plurality of stacks may allow for a greater degree of customization of the thermal flow path, as more curves can be formed and more heat sources or heat sinks can be connected to the conduit. At 816, the orientation of thermal conduction of at least some of the sheets at corresponding positions in the stacking direction in neighboring stacks may be different from each other. This may allow for lateral curving between stacks, gradual curves that extend over multiple stacks, and fine control over the shape of the thermal flow path. At 818, the thermal flow path may traverse the thermal conduit in three dimensions.

At 820, the heat source may be a heat generating component mounted in a head-mounted display (HMD) device and the heat sink may be a heat dissipating component mounted in the HMD device. As HMD devices generate a great amount of heat and have sensitive components, the thermal conduit may keep the HMD device cool, light, and running at acceptable performance levels. At 822, each sheet of the plurality of sheets may comprise a c-axis along which the anisotropically thermally conductive material has a relatively low thermal conductivity compared to at least an a-axis of the sheet. At 824, the method 800 may include configuring, of the plurality of sheets, an entry sheet adjacent to the heat source such that its c-axis forms an entry angle with an adjacent surface of the heat source that is greater than 0° and less than 90°.

A thermal conduit consisting of an anisotropically thermally conductive material has been disclosed herein. The conduit may be tailor made to efficiently conduct heat from one or more heat source to one or more heat sink, taking into account the specific spatial arrangement of the components providing and receiving the heat. This configuration may reduce the thermal resistance into and out of the plane of the conduit that uniform graphite, for example, experiences.

The subject matter of the present disclosure is further described in the following paragraphs. One aspect provides a thermal conduit configured to conduct heat from a heat source to a heat sink, the conduit comprising a plurality of stacked sheets formed of an anisotropically thermally conductive material, each sheet with a respective orientation of thermal conduction, wherein the orientations of thermal conduction of the plurality of sheets change stepwise in a stacking direction to form a curved thermal flow path. In this aspect, the anisotropically thermally conductive material may be graphite. In this aspect, the plurality of sheets may be slices from blocks of the anisotropically thermally conductive material that have been sliced at corresponding angles and stacked such that the orientations of thermal conduction change stepwise in the stacking direction. In this aspect, the thermal flow path comprises at least a first curve from the heat source to a mid portion of the thermal conduit and a second curve from the mid portion to the heat sink. In this aspect, the heat source is a first heat source, the thermal conduit further comprising an introduction path to conduct heat from a second heat source to the heat sink, the introduction path including a third curve and merging with the thermal flow path. In this aspect, the plurality of stacked sheets are formed in a plurality of stacks arranged orthogonally relative to the stacking direction, and the orientation of thermal conduction of at least some of the sheets at corresponding positions in the stacking direction in neighboring stacks are different from each other. In this aspect, at least a portion of the thermal conduit may have an elongated rectangular shape. In this aspect, the thermal flow path may traverse the thermal conduit in three dimensions. In this aspect, the heat source may be a heat generating component mounted in a head-mounted display (HMD) device and the heat sink may be a heat dissipating component mounted in the HMD device. In this aspect, each sheet of the plurality of sheets may comprise a c-axis along which the anisotropically thermally conductive material has a relatively low thermal conductivity compared to at least an a-axis of the sheet, and of the plurality of sheets, an entry sheet adjacent to the heat source may be configured such that its c-axis forms an entry angle with an adjacent surface of the heat source that is greater than 0° and less than 90°.

According to another aspect, a method of forming a thermal conduit configured to conduct heat from a heat source to a heat sink may comprise stacking a plurality of sheets formed of an anisotropically thermally conductive material, each sheet with a respective orientation of thermal conduction, and changing the orientations of thermal conduction of the plurality of sheets stepwise in a stacking direction to form a curved thermal flow path through the thermal conduit. In this aspect, the anisotropically thermally conductive material may be graphite. In this aspect, the method may further comprise slicing the plurality of sheets from blocks of the anisotropically thermally conductive material at corresponding angles to give each sheet the respective orientation of thermal conduction. In this aspect, the thermal flow path may comprise at least a first curve from the heat source to a mid portion of the thermal conduit and a second curve from the mid portion to the heat sink. In this aspect, the heat source may be a first heat source, and the method may further comprise forming an introduction path to conduct heat from a second heat source to the heat sink, the introduction path including a third curve and merging with the thermal flow path. In this aspect, the method may further comprise forming the plurality of stacked sheets in a plurality of stacks arranged orthogonally relative to the stacking direction, wherein the orientation of thermal conduction of at least some of the sheets at corresponding positions in the stacking direction in neighboring stacks are different from each other. In this aspect, the thermal flow path may traverse the thermal conduit in three dimensions. In this aspect, the heat source may be a heat generating component mounted in a head-mounted display (HMD) device and the heat sink may be a heat dissipating component mounted in the HMD device. In this aspect, each sheet of the plurality of sheets may comprise a c-axis along which the anisotropically thermally conductive material has a relatively low thermal conductivity compared to at least an a-axis of the sheet, and the method may further comprise configuring, of the plurality of sheets, an entry sheet adjacent to the heat source such that its c-axis forms an entry angle with an adjacent surface of the heat source that is greater than 0° and less than 90°.

According to another aspect, a thermal conduit may be configured to conduct heat from a heat source to a heat sink, the conduit comprising a plurality of stacked sheets formed of an anisotropically thermally conductive material, each sheet with a respective orientation of thermal conduction, wherein the orientations of thermal conduction of the plurality of sheets change stepwise in a stacking direction to form a curved thermal flow path, the anisotropically thermally conductive material is graphite, and the heat source is a heat generating component mounted in a head-mounted display (HMD) device and the heat sink is a heat dissipating component mounted in the HMD device.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A thermal conduit configured to conduct heat from a heat source to a heat sink, the conduit comprising:
   a plurality of stacked sheets formed of an anisotropically thermally conductive material, each sheet with two respective a-axes of thermal conduction and a respective c-axis along which the anisotropically thermally conductive material has a lower thermal conductivity compared to the a-axes, each sheet having an angle θ between a plane of that sheet and a plane of thermal conduction defined by the a-axes of that sheet;
   wherein, for at least one sheet of the plurality of stacked sheets, the angle θ of the sheet differs stepwise in a stacking direction relative to at least one corresponding angle θ of an adjacent sheet in the plurality of stacked sheets to form a curved thermal flow path.

2. The thermal conduit of claim 1, wherein the anisotropically thermally conductive material is graphite.

3. The thermal conduit of claim 1, wherein the plurality of stacked sheets are slices from blocks of the anisotropically thermally conductive material that have been sliced at corresponding angles and stacked such that the planes of thermal conduction of the one sheet and the adjacent sheet change stepwise in the stacking direction.

4. The thermal conduit of claim 1, wherein the curved thermal flow path comprises at least a first curve from the heat source to a mid portion of the thermal conduit and a second curve from the mid portion to the heat sink.

5. The thermal conduit of claim 4, wherein the heat source is a first heat source, the thermal conduit further comprising an introduction path to conduct heat from a second heat source to the heat sink, the introduction path including a third curve and merging with the curved thermal flow path.

6. The thermal conduit of claim 4, wherein the plurality of stacked sheets are formed in a plurality of stacks arranged orthogonally relative to the stacking direction, and the planes of thermal conduction of at least some of the sheets at corresponding positions in the stacking direction in neighboring stacks are different from each other.

7. The thermal conduit of claim 1, at least a portion of which has an elongated rectangular shape.

8. The thermal conduit of claim 1, wherein the curved thermal flow path traverses the thermal conduit in three dimensions.

9. The thermal conduit of claim 1, wherein the heat source is a heat generating component mounted in a head-mounted display (HMD) device and the heat sink is a heat dissipating component mounted in the HMD device.

10. The thermal conduit of claim 1, wherein:
of the plurality of stacked sheets, an entry sheet adjacent to the heat source is configured such that the c-axis of the entry sheet forms an entry angle with an adjacent surface of the heat source that is greater than 0° and less than 90°.

11. A method of forming a thermal conduit configured to conduct heat from a heat source to a heat sink, the method comprising:
stacking a plurality of sheets formed of an anisotropically thermally conductive material, each sheet with two respective a-axes of thermal conduction and a respective c-axis along which the anisotropically thermally conductive material has a lower thermal conductivity compared to the a-axes, each sheet having an angle θ between a plane of that sheet and a plane of thermal conduction defined by the a-axes of that sheet; and
for at least one sheet of the plurality of stacked sheets, changing the angle θ of the sheet stepwise in a stacking direction relative to at least one corresponding angle θ of an adjacent sheet in the plurality of stacked sheets to form a curved thermal flow path through the thermal conduit.

12. The method of claim 11, wherein the anisotropically thermally conductive material is graphite.

13. The method of claim 11, further comprising:
slicing the plurality of sheets from blocks of the anisotropically thermally conductive material at corresponding angles to give each sheet the respective plane of thermal conduction.

14. The method of claim 11, wherein the curved thermal flow path comprises at least a first curve from the heat source to a mid portion of the thermal conduit and a second curve from the mid portion to the heat sink.

15. The method of claim 11, wherein the heat source is a first heat source, the method further comprising forming an introduction path to conduct heat from a second heat source to the heat sink, the introduction path including a third curve and merging with the curved thermal flow path.

16. The method of claim 11, further comprising:
forming the plurality of stacked sheets in a plurality of stacks arranged orthogonally relative to the stacking direction;
wherein the planes of thermal conduction of at least some of the sheets at corresponding positions in the stacking direction in neighboring stacks are different from each other.

17. The method of claim 11, wherein the curved thermal flow path traverses the thermal conduit in three dimensions.

18. The method of claim 11, wherein the heat source is a heat generating component mounted in a head-mounted display (HMD) device and the heat sink is a heat dissipating component mounted in the HMD device.

19. The method of claim 11, the method further comprising configuring, of the plurality of stacked sheets, an entry sheet adjacent to the heat source such that the c-axis of the entry sheet forms an entry angle with an adjacent surface of the heat source that is greater than 0° and less than 90°.

20. A thermal conduit configured to conduct heat from a heat source to a heat sink, the conduit comprising:
a plurality of stacked sheets formed of an anisotropically thermally conductive material, each sheet with two respective a-axes of thermal conduction and a respective c-axis along which the anisotropically thermally conductive material has a lower thermal conductivity compared to the a-axes, each sheet having an angle θ between a plane of that sheet and a plane of thermal conduction defined by the a-axes of that sheet;
wherein:
for at least one sheet of the plurality of stacked sheets, the angle θ of the sheet differs stepwise in a stacking direction relative to at least one corresponding angle θ of an adjacent sheet in the plurality of stacked sheets to form a curved thermal flow path;
the anisotropically thermally conductive material is graphite; and
the heat source is a heat generating component mounted in a head-mounted display (HMD) device and the heat sink is a heat dissipating component mounted in the HMD device.

* * * * *